(12) United States Patent
Nakazawa

(10) Patent No.: US 8,420,512 B2
(45) Date of Patent: Apr. 16, 2013

(54) METHOD FOR MANUFACTURING SEMICONDUCTOR DEVICE

(75) Inventor: Haruo Nakazawa, Kawasaki (JP)

(73) Assignee: Fuji Electric Co., Ltd. (JP)

( * ) Notice: Subject to any disclaimer, the term of this patent is extended or adjusted under 35 U.S.C. 154(b) by 325 days.

(21) Appl. No.: 12/636,383

(22) Filed: Dec. 11, 2009

(65) Prior Publication Data

US 2010/0173476 A1 Jul. 8, 2010

(30) Foreign Application Priority Data

Dec. 11, 2008 (JP) ................................. 2008-316134

(51) Int. Cl.
- H01L 21/322 (2006.01)
- H01L 21/331 (2006.01)
- H01L 21/336 (2006.01)
- H01L 21/00 (2006.01)
- H01L 21/26 (2006.01)

(52) U.S. Cl.
USPC ........... 438/474; 438/378; 438/795; 438/166; 438/308

(58) Field of Classification Search .................. 438/474, 438/798, 166, 486, 487, 158, 535, 455, 234, 438/550, 308, 473, 795, 198, 378, 165
See application file for complete search history.

(56) References Cited

U.S. PATENT DOCUMENTS

| 5,804,471 | A | 9/1998 | Yamazaki et al. |
| 2003/0106881 | A1 | 6/2003 | Lee et al. |
| 2003/0119281 | A1 | 6/2003 | Suzuki et al. |
| 2005/0059263 | A1 | 3/2005 | Nakazawa et al. |
| 2008/0227277 | A1* | 9/2008 | Nakazawa ..................... 438/550 |
| 2009/0120924 | A1* | 5/2009 | Moffatt et al. ................ 219/385 |

FOREIGN PATENT DOCUMENTS

| JP | 10-308357 A | 11/1998 |
| JP | 2001-110741 A | 4/2001 |
| JP | 2002-43269 A | 2/2002 |
| JP | 2003-007655 A | 1/2003 |
| JP | 2003-59856 A | 2/2003 |
| JP | 2003-171757 A | 6/2003 |
| JP | 2004-140101 A | 5/2004 |
| JP | 2004-140239 A | 5/2004 |
| JP | 2004-253527 A | 9/2004 |
| JP | 2004-273771 A | 9/2004 |
| JP | 3620528 B2 | 11/2004 |
| JP | 2005-223301 A | 8/2005 |
| JP | 2006-351659 A | 12/2006 |
| JP | 2007-111682 A | 5/2007 |
| JP | 4043865 B2 | 11/2007 |
| JP | 2008-244446 A | 10/2008 |

* cited by examiner

Primary Examiner — Chuong A. Luu
(74) Attorney, Agent, or Firm — Rossi, Kimms & McDowell LLP

(57) ABSTRACT

A method for manufacturing a semiconductor device according to the invention irradiates a first pulse laser beam with an irradiation energy density of 1.0 J/cm² or higher to blow off particles on the surface of wafer in activating an impurity layer positioned at a shallow location from the surface of wafer such as p⁺-type collector layer in an FS-type IGBT or in an NPT-type IGBT. By irradiating a second laser beam, region, on which particles were, is activated in the same manner as the region, on which particles are not, and p⁺-type collector layer is formed uniformly. The manufacturing method according to the invention facilitates preventing non-uniform laser beam irradiation from causing in laser annealing and preventing defective devices from causing.

19 Claims, 9 Drawing Sheets

LASER IRRADIATION

METHOD FOR MANUFACTURING SEMICONDUCTOR DEVICE

FIELD OF THE INVENTION

The present invention relates to a method for manufacturing a semiconductor device such as an integrated circuit (hereinafter referred to as an "IC"), a metal oxide semiconductor field effect transistor (hereinafter referred to as a "MOSFET"), and an insulated gate bipolar transistor (hereinafter referred to as an "IGBT").

BACKGROUND

Many ICs today, each of which integrates into one chip many transistors and resistors connected in such a manner as to configure an electric circuit, are used in the important parts of computers and communication equipments. The ICs that include a power semiconductor device are designated as the "power ICs".

The IGBT is a power device that facilitates realizing both the high-speed switching performance and capability of being driven with a voltage of the MOSFET, and the low ON-voltage characteristics of the bipolar transistor. The IGBT is used in the industrial apparatuses such as a general purpose inverter, an AC servo, an uninterruptible power source (hereinafter referred to as a "UPS"), and a switching power supply. The IGBT has been expanding the application fields thereof to the civil instruments such as an electronic oven, a rise cocker, and a stroboscope. Developments of the IGBTs of the next generation have been explored vigorously. Based on the development of a new IGBT employing a new chip structure and exhibiting a lower ON-voltage, the power loss of the apparatus, to which the new IGBT is applied, is reduced and the efficiency thereof is improved.

The structures of the IGBTs may be classified mainly into a punch-through-type IGBT (hereinafter referred to as a "PT-type IGBT"), a non-punch-through-type IGBT (hereinafter referred to as an "NPT-type IGBT"), and a field-stop-type IGBT (hereinafter referred to as an "FS-type IGBT"). Excluding p-channel-type IGBTs used for audio power amplifiers, almost all the IGBTs mass-produced these days are n-channel-type ones having a vertical double-diffusion structure. In the following descriptions, the IGBT will be an n-type IGBT, if not specifically described otherwise. Further, in the following descriptions, electrons or holes are majority carriers in the semiconductor prefixed with "n-type" or "p-type". The symbol "+" or "−" on the shoulder of the letter "n" or "p" indicating the conductivity type of the semiconductor indicates that the semiconductor is doped relatively heavily or relatively lightly.

The PT-type IGBT includes an $n^+$-type layer (n-type buffer layer) between a $p^+$-type epitaxial substrate and an $n^-$-type layer (n-type active layer) such that the depletion layer in the n-type active layer reaches the n-type buffer layer. This structure is the mainstream of the fundamental structure for the IGBTs. It is thick enough for the n-type active layer in the IGBT of the 600 V breakdown voltage class to be around 70 μm. However, if the $p^+$-type epitaxial substrate is included, the total thickness will be from 200 μm to 300 μm. In order to overcome this problem, the NPT-type IGBT and the FS-type IGBT have been developed. The NPT-type IGBT and the FS-type IGBT form therein a shallow $p^+$-type collector layer, the dose amount thereof is low, by employing a floating-zone substrate (hereinafter referred to as an "FZ substrate" formed by the floating zone method (hereinafter referred to as the "FZ method") in substitution for the epitaxial substrate for reducing the thickness and the manufacturing costs thereof.

FIG. 11 is a cross sectional view of an NPT-type IGBT. NPT-type IGBT 100 shown in FIG. 11 includes $n^-$-type FZ substrate (hereinafter referred to as "FZ-N substrate") 1, gate oxide film 4 of $SiO_2$ and such an oxide on FZ-N substrate 1, gate electrode 5 on gate oxide film 4, interlayer insulator film 7 of boro-phospho silicate glass (hereinafter referred to as "BPSG") on gate electrode 5, and surface electrode 6 of an aluminum silicon film and such a metal film on interlayer insulator film 7. On the front surface side of FZ-N substrate 1, $p^+$-type base layer 2 is formed and $n^+$-type emitter layer 3 is formed in $p^+$-type base layer 2. On the back surface side of FZ-N substrate 1, $p^+$-type collector layer 8 is formed and back surface electrode 9 is formed by laminating several kinds of metal films on $p^+$-type collector layer 8.

In NPT-type IGBT 100 having the structure as described above, a shallow $p^+$-type collector, the dose amount thereof is low, is used for $p^+$-type collector layer 8. Since NPT-type IGBT 100 does not employ any $p^+$-type epitaxial substrate, the total thickness of NPT-type IGBT 100 is much thinner than the total thickness of the PT-type IGBT described above.

Since the NPT structure facilitates controlling the hole injection rate, it is possible for the NPT structure to conduct high-speed switching without controlling the carrier lifetime. However, the ON-voltage of the NPT structure is rather high, since the ON-voltage depends on the thickness and resistivity of the n-type active layer. Since an FZ substrate is used in substitution for the $p^+$-type epitaxial substrate, the chip costs can be reduced.

FIG. 12 is a cross sectional view of an FS-type IGBT. In FIG. 12, the same reference numerals as used in FIG. 11 are used to designate the same constituent elements and their duplicated descriptions are omitted for the sake of simplicity. In the same manner as NPT-type IGBT 100 described above, FS-type IGBT 200 shown in FIG. 12 employs FZ-N substrate 1 in substitution for the $p^+$-type epitaxial substrate. The total thickness of FS-type IGBT 200 is from 100 μm to 200 μm. Corresponding to the breakdown voltage of 600 V, the n-type active layer is set to be around 70 μm in thickness, thin enough to be depleted. For depleting the n-type active layer, $n^+$-type layer ($n^+$-type buffer layer) 10 is formed on the back surface of FZ-N substrate 1 in FS-type IGBT 200. On $n^+$-type buffer layer 10, $p^+$-type collector layer 8 and back surface electrode 9 are formed. In other words, a continuous layer structure, in which a p-type layer and an n-type layer are continuous to each other, is formed on the back surface side of FZ-N substrate 1. It is not necessary for FS-type IGBT 200 to conduct lifetime control in the same manner as NPT-type IGBT 100.

For reducing the ON-voltage, an IGBT that combines a trench structure and an FS structure (hereinafter referred to as a "trench-FS IGBT") has been developed. The trench-FS IGBT includes a narrow and deep trench formed in the surface portion thereof and a MOS gate formed on the side face of the trench. Recently, the total thickness of the trench-FS IGBT has been reduced by optimizing the design thereof.

Now the manufacturing method for manufacturing an IGBT will be described below in connection with the manufacture of FS-type IGBT 200 shown in FIG. 12 and with reference to FIGS. 13 through 17. FIG. 13 is a cross sectional view describing the state after the end of the process on the front surface side of FZ-N substrate 1. FIG. 14 is a cross sectional view describing the process of polishing FZ-N substrate 1. FIG. 15 is a cross sectional view describing the process of implanting ions to the back surface of FZ-N substrate 1. FIG. 16 is a cross sectional view describing the process of annealing the back surface of FZ-N substrate 1.

FIG. 17 is a cross sectional view describing the process of forming a back surface electrode film on FZ-N substrate 1. In FIGS. 13 through 17, the same reference numerals as used in FIGS. 11 and 12 are used to designate the same constituent elements and their duplicated descriptions are omitted for the sake of simplicity.

The manufacture of FS-type IGBT 200 may be divided roughly into a front-surface-side process and a back-surface-side process. Now the front-surface-side process will be described below with reference to FIG. 13. First, $SiO_2$ and polysilicon are deposited on the front surface of FZ-N substrate 1, windows are opened through the deposited $SiO_2$ and polysilicon, and gate oxide film 4 and gate electrode 5 are formed. Then, BPSG is deposited, a window is opened through the deposited BPSG, and interlayer insulator film 7 is formed. Thus, an insulated gate structure is formed on the front surface of FZ-N substrate 1.

Then, $p^+$-type base layer 2 is formed on the front surface side of FZ-N substrate 1 and $n^+$-type emitter layer 3 is formed in $p^+$-type base layer 2. Surface electrode 6 that will work for an emitter electrode is formed by depositing an aluminum silicon film such that the aluminum silicon film is in contact with $n^+$-type emitter layer 3. Then, the aluminum silicon film is treated thermally at a low temperature between 400° C. and 500° C. to realize stable adhesiveness and low resistance wiring.

Although not shown in FIGS. 12 and 13, an insulating protector film is formed by employing polyimide and such an insulator on surface electrode 6 such that the insulating protector film is covering surface electrode 6. Now the back surface side process will be described below with reference to FIGS. 14 through 17. First, FZ-N substrate 1 is thinned to the desired thickness as shown in FIG. 14 by the polishing technique such as back grinding and etching applied to the back surface side thereof.

Then, phosphorus ions ($P^+$) and, then, boron ions ($B^+$) are implanted into the back surface side of FZ-N substrate 1 to form $n^+$-type layer 10a and $p^+$-type layer 8a as shown in FIG. 15. Then, FZ-N substrate 1 is thermally treated (annealed) in an electric furnace at a low temperature between 350° C. and 500° C. The heat treatment activates $n^+$-type layer 10a, into which phosphorus ions are implanted, and $p^+$-type layer 8a, into which boron ions are implanted, to form $n^+$-type buffer layer 10 and $p^+$-type collector layer 8 on the back surface side of FZ-N substrate 1. After implanting the boron ions, a surface contact layer (p-type layer) may be formed with no problem by implanting $BF_2$ in the lowermost surface portion of $p^+$-type collector layer 8, that will be in contact with the back surface electrode, for securing an ohmic contact with the back surface electrode.

In manufacturing NPT-type MOSFET 100 shown in FIG. 11, phosphorus ions ($P^+$) are not implanted but boron ions ($B^+$) are implanted into the back surface side of FZ-N substrate 1 in FIG. 15 solely to form $p^+$-type layer 8a. Then, FZ-N substrate 1 is treated thermally in an electric furnace at a low temperature between 350° C. and 500° C. The heat treatment activates $p^+$-type layer 8a, into which boron ions are implanted, to form $p^+$-type collector layer 8 on the back surface side of FZ-N substrate 1.

Then, back surface electrode 9, formed of a metal film combination including an aluminum film, a titanium film, a nickel film and a gold film, is formed on $p^+$-type collector layer 8. Finally, FZ-N substrate 1 is diced into chips, an aluminum wire electrode is fixed to the surface of surface electrode 6 by an ultrasonic wire bonding apparatus, and back surface electrode 9 is connected to a predetermined fixing stuff via a solder layer.

Recently, a matrix converter, which conducts a direct AC to AC conversion without interposing any DC between the AC and AC, has been attracting much attention. The matrix converter is different from the conventional converter in that the matrix converter does not need any capacitor. The matrix converter is advantageous, since the power supply higher harmonics are reduced. However, since the input to the matrix converter is an AC, it is required for the semiconductor switch to exhibit a certain reverse withstand voltage. If a conventional IGBT is used, it will be necessary to connect diodes for reverse blocking in series to each other.

FIG. 18 is a cross sectional view of a reverse blocking IGBT. In FIG. 18, the same reference numerals as used in FIG. 11 are used to designate the same constituent elements and their duplicated descriptions are omitted for the sake of simplicity. As shown in FIG. 18, reverse blocking IGBT 300 succeeds the fundamental properties of the conventional IGBT. Moreover, reverse blocking IGBT 300 is made to exhibits a reverse withstand voltage by pt-type isolation layer 11 formed therein. Since it is unnecessary to provide reverse blocking IGBT 300 having the structure described above with a series connection of diodes, the conduction loss may be halved and the conversion efficiency of a matrix converter may be improved greatly. If a technique for forming a deep junction, 100 μm or deeper, and a manufacturing technique for manufacturing an extremely thin wafer, 100 μm or thinner, are combined, it will be possible to manufacture a reverse blocking IGBT that exhibits excellent performances.

If the wafer thickness is reduced, the wafer rigidity will be impaired greatly. After the wafer is thinned, the wafer may not be so strong enough as to be held with an arm or with a jig in the subsequent manufacturing steps or in the subsequent transfer steps. For obviating the problem described above, a rib wafer having a rib structure on the back surface side thereof has been proposed (cf. the following Japanese Patent Publication No. 3620528 and Japanese Unexamined Patent Application Publication No. 2004-253527). On the back surface side of the rib wafer, the edge area of the wafer is thicker than the central area thereof. By employing the rib structure, the strength of the wafer is improved greatly and the cracking and parting of the wafer are reduced in handling the wafer during the transport steps thereof.

However, many other technical problems are posed on manufacturing an IGBT. For example, for obtaining an extremely thin IGBT of around 70 μm thick, it is necessary to conduct back surface grinding from the back surface side of the wafer, to conduct ion implantation from the back surface side of the wafer, and to thermally treat the back surface side of the wafer. During the treatments described above, bending may be caused in the wafer.

Various techniques have been investigated so far for activating the p-type impurity layer (p-type layer) and the n-type impurity layer (n-type layer) in the IGBT and such semiconductor devices. The activation techniques are indispensable for forming various semiconductor devices including the IGBT. In addition to the activation technique that employs an electric furnace as described above, activation techniques that anneal an impurity layer with a laser to activate the impurity layer have been developed. For example, a wafer is fixed to a supporting base board with an adhesive sheet for preventing the wafer from cracking and parting and a laser beam is irradiated to the wafer to activate the p-type layer and the n-type layer (cf. the following Japanese Unexamined Patent Application Publication No. 2004-140101). One of the techniques investigated employs the second higher harmonics of an yttrium aluminum garnet laser (hereinafter referred to as a "YAG 2ω laser") and the other one of the techniques investigated employs the third higher harmonics of a YAG laser (hereinafter referred to as a "YAG 3ω laser") for the activation (cf. the following Japanese Unexamined Patent Application Publication No. 2003-059856 and Japanese Unexamined Patent Application Publication No. 2005-223301).

For the laser annealing techniques, it has been proposed to activate the impurities in the regions, the depths thereof from the substrate surface are different, by irradiating laser beams, the pulse widths thereof or the energy densities thereof are different from each other (cf. the following Japanese Patent Publication No. 4043865).

The lasers are used for the treatments other than the laser annealing for activating the impurities. For example, the lasers are used for removing a surface protector film formed on a metal electrode film by laser abrasion to bore an opening through the surface protector film for leading out an electrode terminal and for applying a cleaning treatment including plasma ashing to the surface of the opening bored (cf. the following Japanese Unexamined Patent Application Publication No. 2004-273771).

An apparatus has been proposed for judging, under the vacuum as well as not under the vacuum, whether the cleaning of a substrate surface using a laser is finished or not (cf. the following Japanese Unexamined Patent Application Publication No. 2002-043269).

However, it is impossible for the conventional annealing in an electric furnace to highly activate the p-type layer. When it is necessary to conduct annealing in an electric furnace at 300° C. or higher, the technique that uses an adhesive sheet to prevent wafer cracking from causing is unemployable, since the adhesive sheet is resistive against heat usually at 200° C. or lower.

When the p-type and n-type layers are activated by laser annealing in place of electric furnace annealing, a laser beam is irradiated with a high energy density from the back surface side of a thin wafer that subjected to the front-surface-side process and the back grinding. Due to this, the temperature of the surface opposite to the surface irradiated with a laser beam, that is the front surface, on which a gate structure is formed through the front-surface-side process, becomes high. In detail, when the wafer is 70 μm thick, the temperature on the front wafer surface may rise to about 500° C. As the temperature on the front wafer surface rises to 500° C., the surface electrode and the insulating protector film on the surface electrode will melt and the device will be broken down.

When laser annealing is conduced with a single pulse, it will be necessary to conduct irradiation for a long time and it will take several hr. to anneal a sheet of wafer. Machining traces will be caused sometimes in the wafer surface by laser irradiation, since a laser beam, the irradiation energy density thereof is high, is irradiated.

FIGS. 19 and 20 are cross sectional views of a wafer for explaining the problems caused by the conventional laser annealing. As shown in FIG. 19, particles 20 such as dusts may be on the back surface of a wafer (e.g. FZ-N substrate 1) sometimes. When a shallow p-type layer and a shallow n-type layer, about 1 μm deep from the back surface of wafer 1, are activated by laser annealing, region 21, on which particle 20 is, is not irradiated with a laser beam and the impurity in region 21 is not activated. If the p-type and n-type layer are not formed normally, a large leakage current will be caused, the contact resistance of the electrode formed on the back surface of the wafer will be large and such detects will be caused in the device.

In view of the foregoing, it would be desirable to obviate the problems described above. It would be also desirable to provide a method for manufacturing a semiconductor device that facilitates preventing nonuniform laser irradiation from causing during laser annealing and preventing defective devices from causing.

SUMMARY OF THE INVENTION

The present invention provides a method for manufacturing a semiconductor device that includes:
  (a) irradiating a first pulse laser beam to the surface of a semiconductor, thereto a dopant ion is implanted, with an irradiation energy density 1.0 J/cm$^2$ or higher but low enough to leave no machining trace in the surface of the semiconductor for blowing off particles on the surface of the semiconductor; and
  (b) irradiating a second pulse laser beam to the surface of the semiconductor with an irradiation energy density high enough to activate the impurity layer, thereto the dopant ion is implanted, but low enough to leave no machining trace in the surface of the semiconductor for activating the impurity layer.

In accordance with one preferred embodiment of the invention, the delay time between the start of irradiating first pulse laser beam in the step (a) and the start of irradiating the second pulse laser beam in the step (b) (hereinafter referred to as the "delay time between the first pulse laser beam and the second pulse laser beam") is between about 0 ns or longer and about 1000 ns or shorter.

In a further preferred embodiment, the method further includes the step of
  (c) irradiating a third pulse laser beam once or more times to the surface of the semiconductor with an irradiation energy density high enough to activate the impurity layer, thereto the dopant ion is implanted, but low enough to leave no machining trace in the surface of the semiconductor, the step (c) being conducted in subsequent to the step (b).

The pulse laser beam is irradiated from an all-solid-state laser or from an excimer laser, and the irradiation energy density for activating the impurity layer in the semiconductor, thereto the dopant ion is implanted, is 0.6 J/cm$^2$.

The impurity layer is preferably a monolayer in accordance with a preferred embodiment of the invention.

According to a further embodiment of the invention, the impurity layer includes continuous layers, the conductivity types thereof are the same or the conductivity types thereof are different from each other.

According to a further embodiment of the invention, a method of manufacturing a semiconductor device includes:
  (a) irradiating a first pulse laser beam to the surface of a semiconductor, thereto dopant ions are implanted, with an irradiation energy density 1.2 J/cm$^2$ or higher but low enough to leave no machining trace in the surface of the semiconductor for blowing off the particles on the surface of the semiconductor and for activating a first impurity layer; and
  (b) irradiating a semiconductor laser beam to the surface of the semiconductor for activating a second impurity layer located more deeply than the first impurity layer activated through the step (a).

According to a further embodiment of the invention a method for manufacturing a semiconductor device is provided that includes the steps of:
  (a) irradiating a semiconductor laser beam to the surface of a semiconductor, thereto dopant ions are implanted, for activating a first impurity layer; and (b) irradiating a first pulse laser beam to the surface of the semiconductor with an irradiation energy density 1.2 J/cm² or higher but low enough to leave no machining trace in the surface of the semiconductor for blowing off particles on the surface of the semiconductor and for activating a second impurity layer located more shallowly than the first impurity layer activated through the step (a).

According to a further embodiment, the semiconductor laser beam is irradiated continuously, and the first pulse laser beam is irradiated from an all-solid-state laser or from an excimer laser.

Still further, according to a further embodiment, a method for manufacturing a semiconductor device is provided that includes:

(a) irradiating a semiconductor laser beam to the surface of a semiconductor, thereto a first dopant ion is implanted, for activating a first impurity layer;

(b) irradiating a first pulse laser beam to the surface of the semiconductor with an irradiation energy density 1.0 J/cm² or higher but low enough to leave no machining trace in the surface of the semiconductor for blowing off particles on the surface of the semiconductor; and (c) irradiating a second pulse laser beam to the surface of the semiconductor with an irradiation energy density high enough to activate a second impurity layer, thereto a second dopant ion is implanted, but low enough to leave no machining trace in the surface of the semiconductor for activating the second impurity layer located more shallowly than the first impurity layer activated through the step (a).

According to a further embodiment, the delay time between the first pulse laser beam irradiated in the step (b) and the second pulse laser beam irradiated in the step (c) is about 0 ns or longer and about 1000 ns or shorter.

According to further embodiment, the pulse laser beam is irradiated from an all-solid-state laser or from an excimer laser, and the irradiation energy density necessary for activating the second impurity layer, into which the second dopant ion is implanted, is 0.6 J/cm².

According to a further embodiment, the wavelength of the pulse laser beam is 150 nm or longer and 550 nm or shorter, and the wavelength of the semiconductor laser beam is different from the wavelength of the pulse laser beam.

According to a further embodiment, the pulse laser beam is irradiated from an all-solid-state laser, and the irradiation energy density thereof for leaving no machining trace in the surface of the semiconductor is 4.0 J/cm².

According to a further embodiment, the pulse laser beam is irradiated from an excimer laser, and the irradiation energy density thereof for leaving no machining trace in the surface of the semiconductor is 1.4 J/cm².

According to the invention, the particles on the wafer surface can be blown off through the step (a) and the impurity layer is activated through the step (b) without being affected adversely by the particles. Since any nonuniform laser beam irradiation is not caused and a normal impurity layer is obtained, defective devices are prevented from causing.

According to the invention, a continuous layer structure including a plurality of impurity layers, the conductivity types thereof are the same or different from each other, can be activated normally. Therefore, defects are prevented from causing in manufacturing an FS-type IGBT that has a continuous layer structure formed of a p-type layer and an n-type layer on the back surface side of a wafer.

The method for manufacturing a semiconductor device according to the invention facilitates preventing nonuniform laser beam irradiation from causing during laser annealing and preventing defective devices from causing.

BRIEF DESCRIPTIONS OF THE DRAWINGS

The invention will be described with reference to certain preferred embodiments thereof and the accompanying drawing, wherein.

DETAILED DESCRIPTION OF THE PREFERRED EMBODIMENTS

Figure 11:
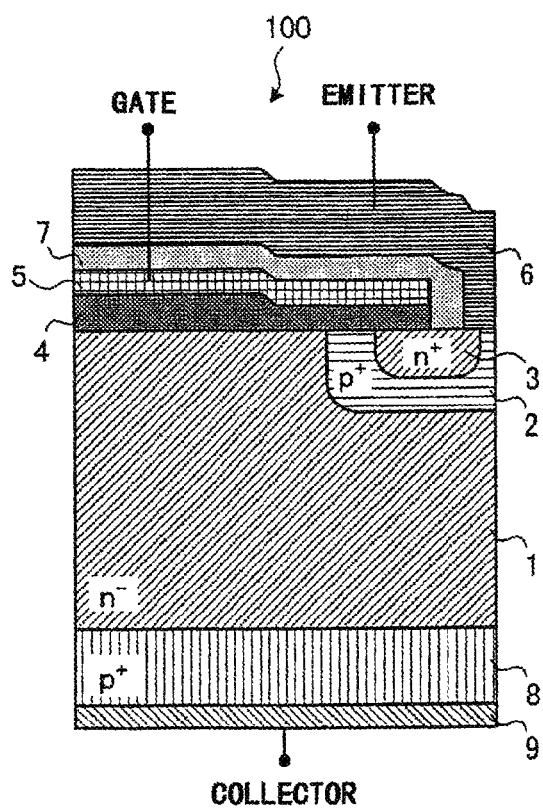
FIG. 11 is a cross sectional view of an NPT-type IGBT.
Figure 12:
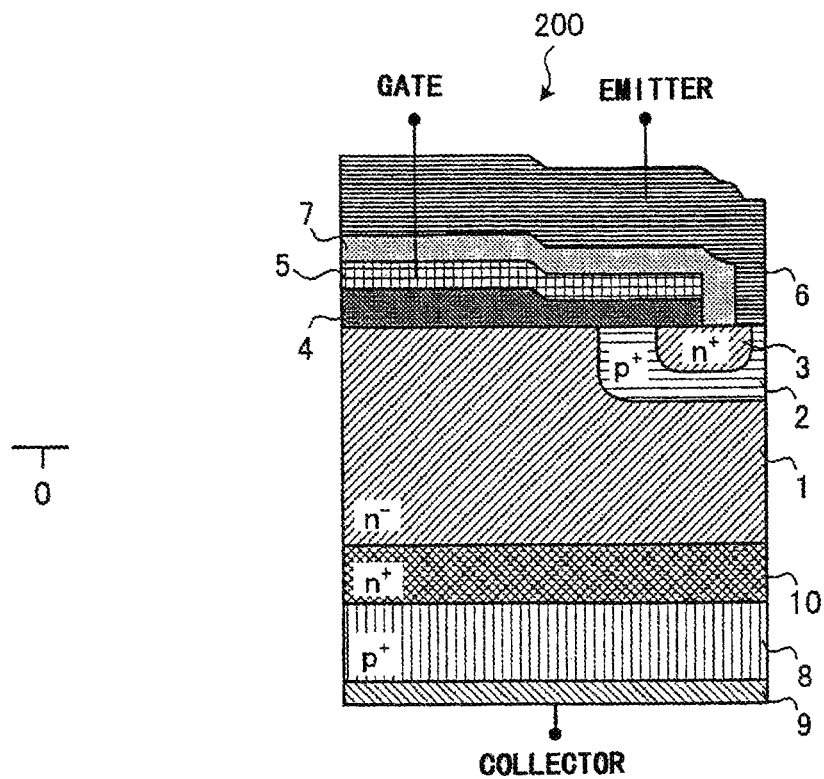
FIG. 12 is a cross sectional view of an FS-type IGBT.
Figure 13:
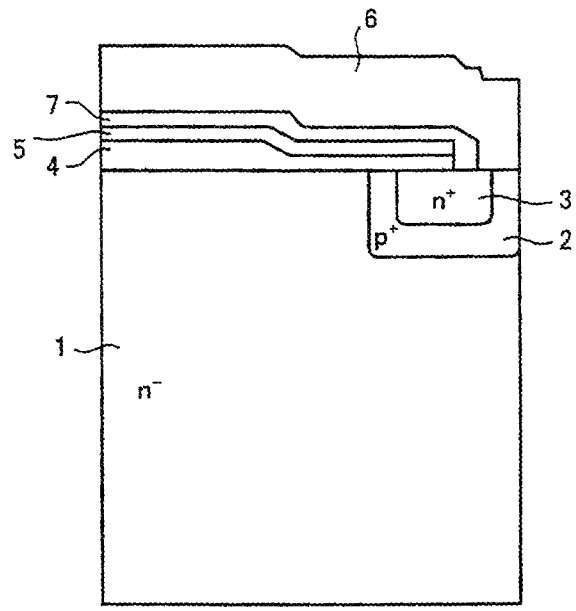
FIG. 13 is a cross sectional view describing the state after the end of the process on the front surface side of a substrate.
Figure 14:
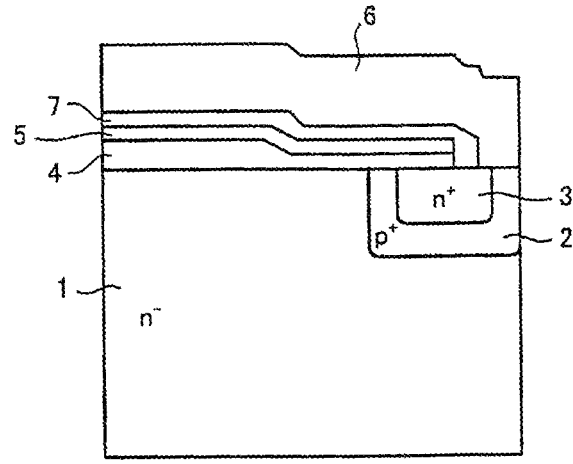
FIG. 14 is a cross sectional view describing the process of polishing the substrate.

A method for manufacturing a semiconductor device according to a first embodiment of the invention will be described below in connection with the manufacture of an NPT-type IGBT, although the manufacturing method according to the first embodiment is applicable to the manufacture of the other types of semiconductor devices. The manufacturing method according to the first embodiment employs two laser beams for activating pt-type collector layer 8 formed in the surface portion on the back surface side of a wafer in manufacturing the NPT-type IGBT shown in FIG. 11. According to the first embodiment, two laser beams are obtained, for example, from two all-sold-state YAG 2ω lasers, the oscillation wave length thereof is 532 nm.

Figure 1:
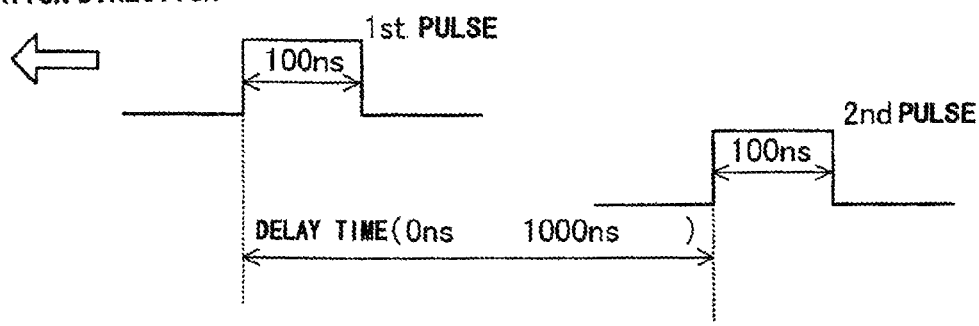
FIG. 1 is a diagram describing the waveforms of pulse laser beams irradiated from two laser beam irradiators.
Figure 2:
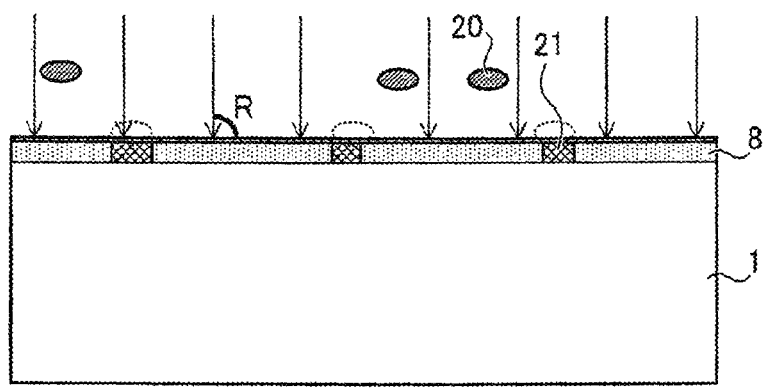
FIG. 2 is a cross sectional view of a wafer describing the state of the wafer surface.

FIG. 1 is a diagram describing the waveforms of pulse laser beams irradiated from two laser beam irradiators. FIG. 2 is a cross sectional view of a wafer describing the state of the wafer surface. For irradiating a pulse laser beam, a pulse laser oscillator is used. Alternatively, laser pluses may be obtained by making ON and OFF a light source. Still alternatively, a light source is illuminated continuously and a shutter is opened and closed to irradiate a laser beam for the periods of time necessary for the activation. In the following descriptions, a pulse laser beam or laser pulses are obtained by any of the methods described above.

In irradiating laser beams, the half-widths (corresponding to the pulse widths) of two laser beams are set, for example, at 100 ns as shown in FIG. 1. Although described in detail later, the irradiation energy density of a first laser beam (first laser pulse) is set to be 1.0 J/cm$^2$ or higher and the irradiation energy density of a second laser beam (second laser pulse) is set at a value high enough to activate pt-type collector layer 8.

It is preferable to set the upper limits of the irradiation energy densities of the first and second laser beams at a value low enough not to affect the front surface side of the wafer. Specifically, it is preferable to set the upper limits of the irradiation energy densities of the first and second laser beams at a value low enough not to melt the electrodes on the front surface side of the wafer. It is more preferable to set the upper limits of the irradiation energy densities of the first and second laser beams at a value low enough to leave no laser machining trace in the region on the back surface side of the wafer, to which any of the first and second laser beams is irradiated. For example, the delay time from the start of irradiating the first pulse laser beam to the start of irradiating the second pulse laser beam (hereinafter referred to as the "delay time between the first pulse laser beam and the second pulse laser beam") is set to be 0 ns or longer and 1000 ns or shorter.

By setting the laser irradiation conditions as described above, abrasions are caused in the surface of wafer 1 by irradiating the first laser beam as shown in FIG. 2 and particles 20 on the surface of wafer 1 are blown off. By further irradiating the second laser beam, the surface portion of wafer 1 in region 21, on which particle 20 was, is activated in the same manner as the surface portion of wafer 1 in the region, on which any particle 20 is not. Therefore, nonuniform irradiation is prevented from causing and pt-type collector layer 8 is formed uniformly.

It is preferable to set the laser irradiation angle R to the surface of wafer 1 at the right angles or almost at the right angles as shown in FIG. 2. If the laser irradiation angle R is set at the right angles or almost at the right angles, the irradiation energy density of the laser bean is utilized efficiently. If the laser irradiation angle R is set at the right angles or almost at the right angles, the irregularly reflected laser beams will not affect adversely such that the irregularly reflected laser beams will not heat up wafer 1 high enough to anneal wafer 1, since the irregularly reflected laser beams do not focus to wafer 1.

The beam size may be changed considering the dimensions of the chips formed in wafer 1. In detail, the entire surface of wafer 1 is irradiated once. Alternatively, the surface of wafer 1 is divided into two or more areas and all the divided areas are irradiated so that the entire surface of wafer 1 may be irradiated at least once. In scanning the laser beam to irradiate the entire surface of wafer 1, it is effective to superpose the areas irradiated by the laser beam for around 5% in the direction perpendicular to the scanning direction of the laser beam.

Figure 3:
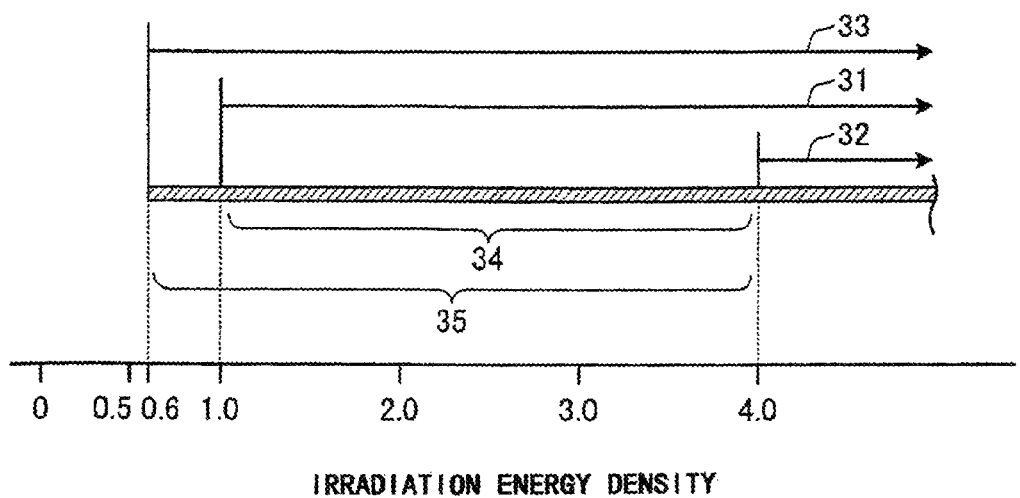
FIG. 3 is a diagram describing the effective range for the irradiation energy density of an all-solid-state laser.

Now the effective range for the irradiation energy density of an all-solid-state laser will be described below. FIG. 3 is a diagram describing the effective range for the irradiation energy density of an all-solid-state laser. As shown in FIG. 3, a range designated by the reference numeral 31 is the range, in which the irradiation energy density is high enough to blow off the particles on the wafer surface. A range designated by the reference numeral 32 is the range, in which the irradiation energy density is high enough to shave the irradiated portion and to leave a machining trace therein. A range designated by the reference numeral 33 is the range, in which the irradiation energy density of the second laser beam or the irradiation energy densities of further laser beams are high enough to activate the surface portion of the wafer.

When an all-solid-state laser such as a YAG 2ω pulse laser is employed, it is preferable to set the irradiation energy density of the first laser beam to be high enough to blow off the particles on the wafer surface but low enough to leave no machining trace in the wafer surface as shown in FIG. 3. Therefore, it is preferable for effective range 34 of the irradiation energy density of the first laser beam to be 1.0 J/cm$^2$ or higher and 4.0 J/cm$^2$ or lower. It is preferable to set the irradiation energy density of the second laser beam to be high enough to activate the surface portion of the wafer, from which particles are blown off, but low enough to leave no machining trace in the wafer surface. Therefore, it is preferable for effective range 35 of the irradiation energy density of the second laser beam to be 0.6 J/cm$^2$ or higher and 4.0 J/cm$^2$ or lower.

When the irradiation energy density of the second laser beam is equal to or higher than that of the first laser beam, it is preferable for the irradiation energy density of the second laser beam to be 1.2 J/cm$^2$ or higher. When the irradiation energy density of the second laser beam is lower than that of the first laser beam, pt-type collector layer 8 will not be formed, even if the irradiation energy density of the second laser beam is 1.2 J/cm$^2$ or higher.

If described in detail, when the irradiation energy density of the first laser beam is 1.0 J/cm$^2$ and the irradiation energy density of the second laser beam is 0.2 J/cm$^2$, the second laser beam irradiation will not almost change the temperature of the wafer surface portion and, therefore, pt-type collector layer 8 (shown in FIG. 2) will not be formed. Therefore, it is necessary for the irradiation energy density of the second laser beam, for example, to be as high as 0.6 J/cm$^2$. Although the irradiation energy density range of the second laser beam or the irradiation energy density ranges of further laser beams high enough to activate the wafer surface portion are set, for example, to be 0.6 J/cm$^2$ or higher as described in FIG. 3, the irradiation energy density of the second laser beam or the irradiation energy densities of the further laser beams may be lower than 0.6 J/cm$^2$ with no problem as far as pt-type collector layer 8 can be formed.

Figure 4:
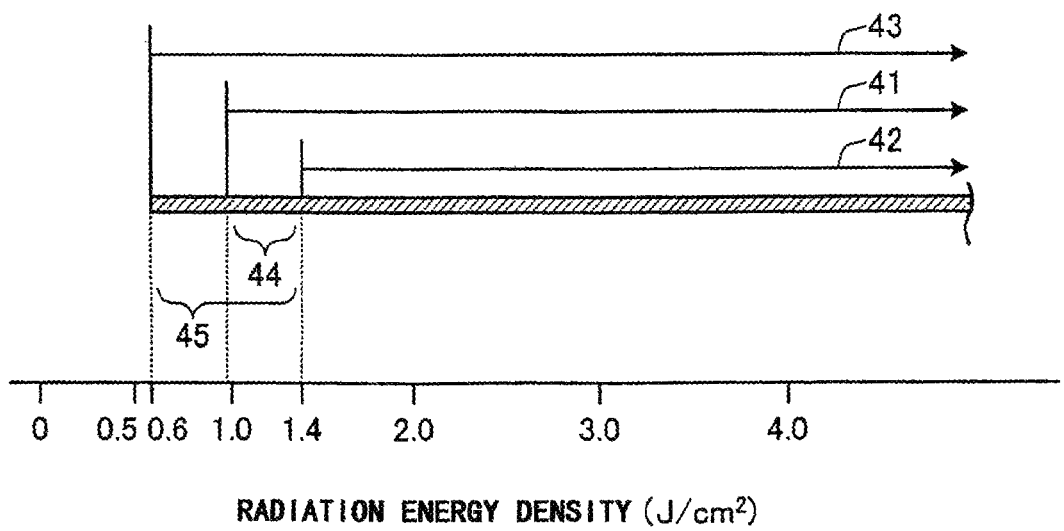
FIG. 4 is a diagram describing the effective range for the irradiation energy density of an excimer laser.

Now the effective range for the irradiation energy density of an excimer laser will be described below. FIG. 4 is a diagram describing the effective range for the irradiation energy density of an excimer laser. As shown in FIG. 4, a range designated by the reference numeral 41 is the range, in which the irradiation energy density is high enough to blow off the particles on the wafer surface. A range designated by the reference numeral 42 is the range, in which the irradiation energy density is high enough to shave the irradiated portion and to leave a machining trace therein. A range designated by the reference numeral 43 is the range, in which the irradiation energy density of the second laser beam or the irradiation energy densities of further laser beams are high enough to activate the surface portion of the wafer. When the laser is an excimer laser, range 42, in which the irradiation energy density is high enough to shave the irradiated portion and to leave a machining trace therein, is different from irradiation energy density range 32 for the all-solid-state laser.

When an excimer laser such as a XeCl laser is employed, it is preferable to set the irradiation energy density of the first laser beam to be high enough to blow off the particles on the wafer surface but low enough to leave no machining trace in the wafer surface as shown in FIG. 4. Therefore, it is preferable for effective range 44 of the irradiation energy density of the first laser beam to be 1.0 J/cm$^2$ or higher and 1.4 J/cm$^2$ or lower. It is preferable to set the irradiation energy density of the second laser beam to be high enough to activate the surface portion of the wafer, from which particles are blown off, but low enough to leave no machining trace in the wafer surface. Therefore, it is preferable for effective range 45 of the irradiation energy density of the second laser beam to be 0.6 J/cm$^2$ or higher and 1.4 J/cm$^2$ or lower.

Figure 5:
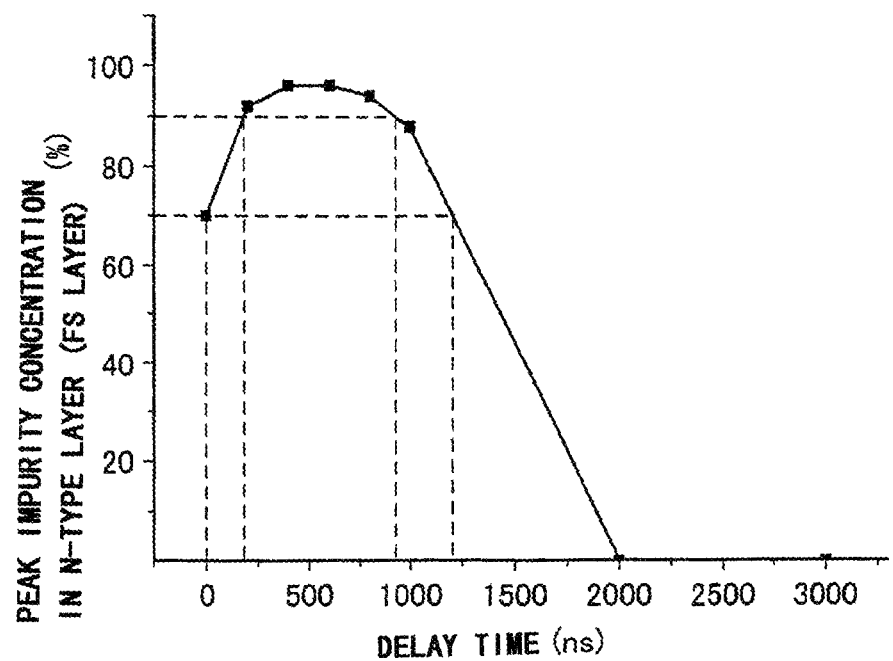
FIG. 5 is a curve relating the delay time with the impurity concentration.

Now the delay time will be described below. FIG. 5 is a curve relating the delay time with the impurity concentration. In FIG. 5, the vertical axis represents the impurity concentration ratio, the 100% thereof is set at the peak impurity concentration obtained by the conventional annealing conducted in an electric furnace at 900° C. for 30 min. The horizontal axis represents the delay time between the first pulse and the second pulse.

When the delay time is between 0 ns and 1200 ns, the peak impurity concentration is 70% or higher as described in FIG. 5, indicating that the delay time is effective for the activation. When the delay time is between 200 ns and 900 ns, the peak impurity concentration is preferable 90% or higher, indicating that the delay time is more effective for the activation.

Now a manufacturing method according to a working example 1 of the invention will be described below in connection with the activation of one single impurity layer (hereinafter referred to as a "monolayer") by laser annealing. Here, pt-type collector layer 8 in an NPT-type IGBT is assumed to be an example of a monolayer. First, boron ions (B$^+$) are implanted into the surface portion on the back surface side of a silicon wafer at the dose amount of 1×10$^{15}$ cm$^{-2}$ and under the acceleration voltage of 50 keV.

It is preferable to further implant BF$_2$ into the lowermost surface portion of the silicon wafer after the boron ion implantation into the surface portion of the silicon wafer. A p-type contact layer is formed by the BF$_2$ implantation in the lowermost surface portion of the silicon wafer. The p-type contact layer formed secures an ohmic contact with the back surface electrode in contact with the back surface of the silicon wafer.

Figure 6:
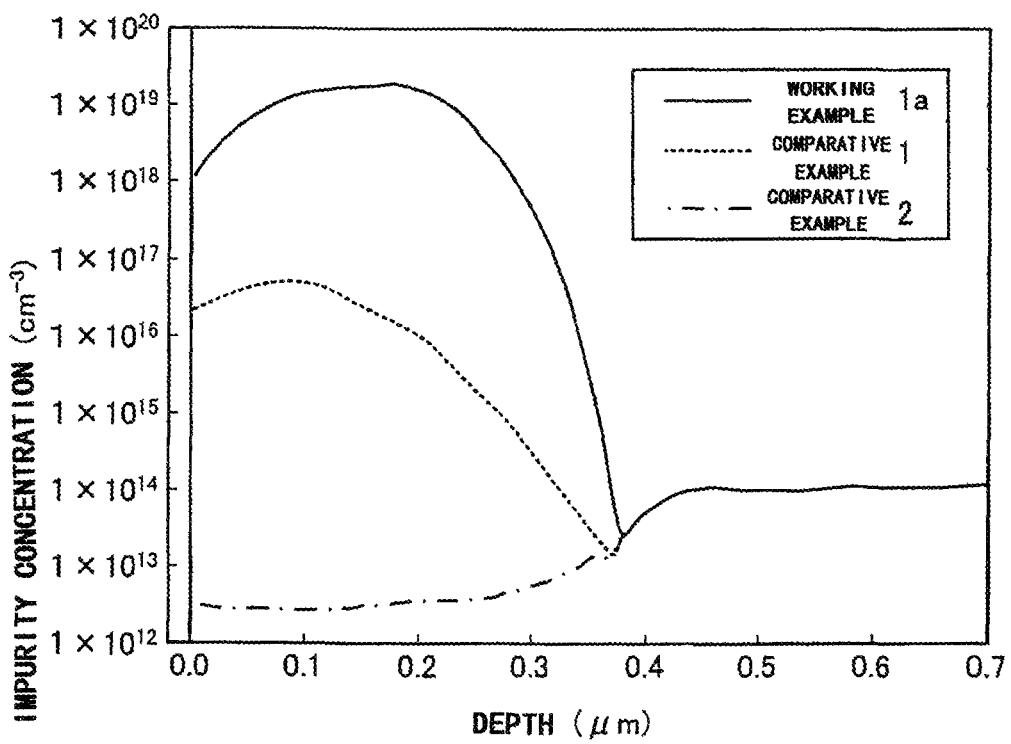
FIG. 6 is a set of curves describing the impurity concentration profiles in the depth direction from the silicon wafer surface according to a first embodiment of the invention.
Figure 7:
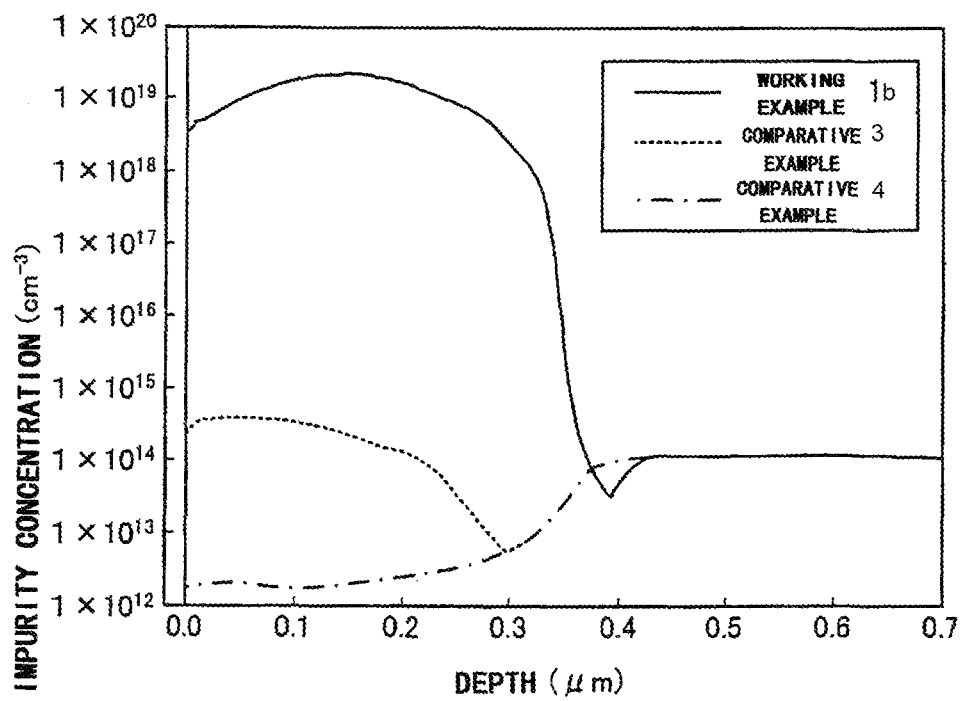
FIG. 7 is another set of curves describing the impurity concentration profiles in the depth direction from the silicon wafer surface according to the first embodiment of the invention.

Subsequently, YAG 2ω laser pulses, the half widths thereof are 100 ns, are irradiated from two laser beam irradiators with a delay time of 400 ns. The impurity concentration profiles, measured by the spreading resistance profiling method, in the depth direction from the laser-irradiated surface (the surface irradiated with the laser beams) of the silicon wafer obtained as described above are described in FIGS. 6 and 7. In FIGS. 6 and 7, the depth of 0 μm represents the laser-irradiated surface. (In FIGS. 8 and 10, the depth of 0 μm also represents the laser-irradiated surface.)

In FIG. 6, the solid curve designated as the working example 1a represents the result obtained by irradiating the first laser beam at the irradiation energy density of 1.0 J/cm$^2$ and the second laser beam at the irradiation energy density of 0.6 J/cm$^2$. The dotted curve designated as the comparative example 1 and the single dotted chain curve designated as the comparative example 2 represent the results obtained by irradiating the first laser beam at the irradiation energy density of 0.7 J/cm$^2$ and the second laser beam at the irradiation energy density of 0.9 J/cm$^2$. The result of the comparative example 1 is obtained by measuring the region, on which any particle is not. The result of the comparative example 2 is obtained by measuring the region, on which particles are located.

As FIG. 6 indicates, boron atoms are diffused sufficiently from the laser-irradiated-surface to the depth of around 0.3 μm according to the working example 1a. It is found that insufficient activation is caused in the comparative example 1, since the irradiation energy density is low and the impurity concentration is low. It is found that the specimen according to the comparative example 2 is not activated at all, since the particles on the silicon wafer surface are left unremoved.

Thus, it is obvious that insufficient activation will be caused, if the irradiation energy density of the first laser beam is lower than 1.0 J/cm$^2$, even when the total energy density of the first and second laser beams is 1.6 J/cm$^2$ or higher.

Now the results obtained by irradiating the first and second laser beams at the same irradiation energy density will be described with reference to FIG. 7. If the first and second laser beams are irradiated at the same irradiation energy density, the settings will be conducted easily, since it is not necessary to change the irradiation conditions between the first and second laser beams. In FIG. 7, the solid curve designated as the working example 1b represents the result obtained by irradiating the first and second laser beams at the irradiation energy density of 1.7 J/cm$^2$. The dotted curve designated as the comparative example 3 and the single dotted chain curve designated as the comparative example 4 represent the results obtained by irradiating the first and second laser beams at the irradiation energy density of 0.5 J/cm$^2$. The result of the comparative example 3 is obtained by measuring the region, on which any particle is not. The result of the comparative example 4 is obtained by measuring the region, on which particles are located.

As FIG. 7 indicates, the laser beam irradiation according to the working example 1b increases the impurity concentration and, therefore, realizes sufficient activation, since the laser beam irradiation according to the working example 1b causes abrasions in the silicon wafer surface and blows off the particles on the wafer surface.

It is found that insufficient activation is caused according to the comparative example 3, since the irradiation energy density is low and the impurity concentration is low. It is found that the specimen according to the comparative example 4 is not activated at all, since the particles on the silicon wafer surface are left unremoved.

According to the first embodiment, the first laser beam irradiation causes abrasions in the wafer surface and blows off the particles on the wafer surface. The second laser beam irradiation facilitates activating the impurity layer without being affected adversely by the particles and preventing non-uniform irradiation from causing. Since it is possible to activate the impurity layer normally, defective devices are prevented from causing. By changing the delay time between the first pulse and the second pulse, by changing the respective irradiation energy densities of the first and second laser beams appropriately, or by increasing the number of the laser beam irradiators, the diffusion depth and concentration of boron can be adjusted.

The manufacturing method according to the first embodiment has been described in connection with the use of two laser beam irradiators. Alternatively three or more laser beam irradiators may be used with no problem. When three or more laser beam irradiators are used, it is preferable to set the irradiation energy density of the first laser beam to be 1.0 J/cm$^2$ or higher and to set the irradiation energy density of the second laser beam or the irradiation energy densities of further laser beams to be 0.6 J/cm² or higher.

The number of laser beam irradiators and the laser beam irradiation conditions may be selected appropriately to obtain the desired performances depending on the diffusion depth and the activation rate of the dopant as far as they are in the above described preferable range.

Among the laser beam irradiation conditions described above, it is preferable to employ two laser beam irradiators to set the delay time between the first pulse and the second pulse to be 0 ns or longer and 1000 ns or shorter. If the same kind of laser is used and if a laser beam can be irradiated continuously at intervals of 1000 ns or shorter, one laser beam irradiator may be used with no problem.

A method for manufacturing a semiconductor device according to a second embodiment of the invention will be described below in connection with the activation of continuous layers by laser annealing. The manufacturing method according to the second embodiment will be described in connection with the manufacture of an FS-type IGBT, although the manufacturing method according to the second embodiment is applicable to the manufacture of the other types of semiconductor devices.

Figure 15:
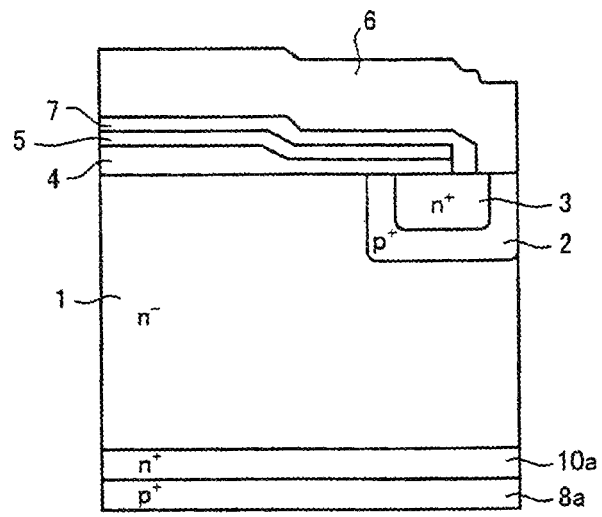
FIG. 15 is a cross sectional view describing the process of implanting ions to the back surface of the substrate.
Figure 16:
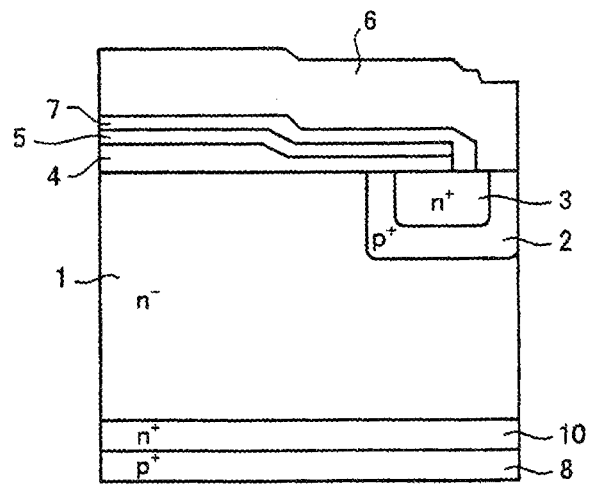
FIG. 16 is a cross sectional view describing the process of annealing the back surface of the substrate.
Figure 17:
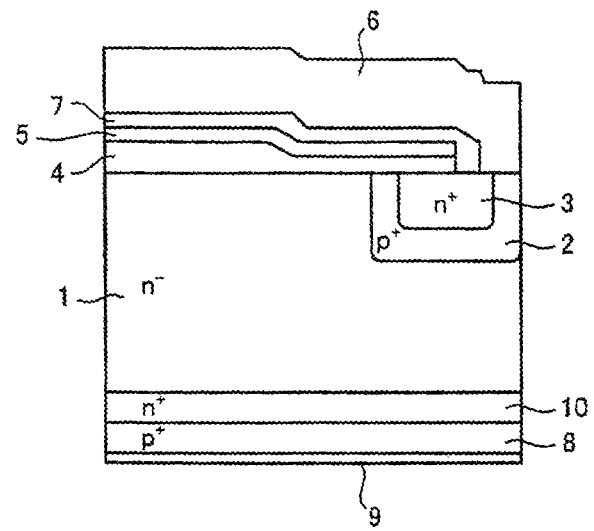
FIG. 17 is a cross sectional view describing the process of forming a back surface electrode film on the substrate.
Figure 18:
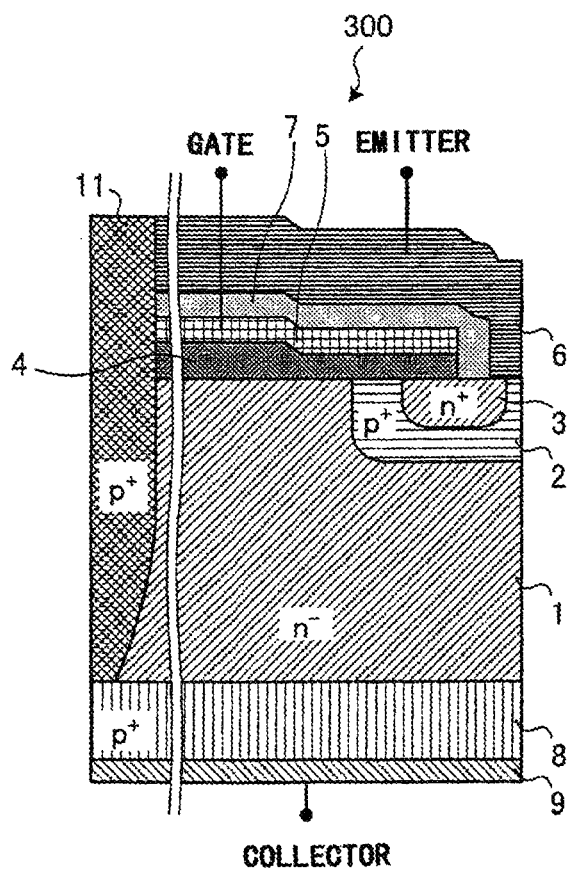
FIG. 18 is a cross sectional view of a reverse blocking IGBT.
Figure 19:
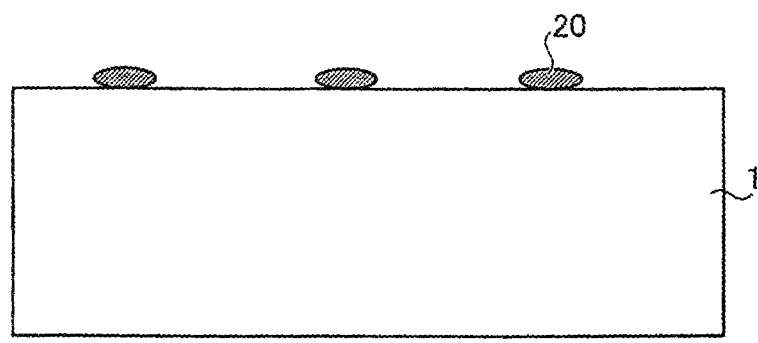
FIG. 19 is a cross sectional view of a wafer for explaining the problems caused by the conventional laser annealing.
Figure 20:
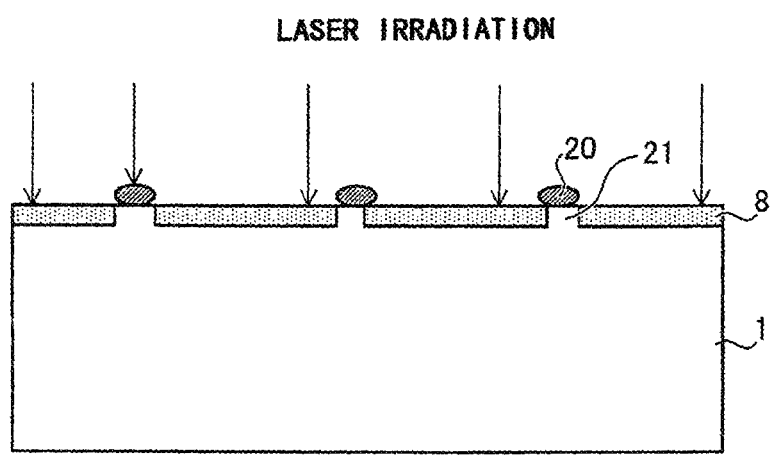
FIG. 20 is another cross sectional view of a wafer for explaining the problems caused by the conventional laser annealing.

The manufacturing method according to the second embodiment implants phosphorus ions (Pt) to the back surface side of a wafer to form n⁺-type layer 10a as shown in FIG. 15, implants boron ions (B⁺) to the back surface side of the wafer to form p⁺-type layer 8a as shown in FIG. 15, and conducts laser annealing using two laser beams. The laser annealing activates n⁺-type layer 10a and p⁺-type layer 8a to form n⁺-type buffer layer 10 and p⁺-type collector layer 8 shown in FIG. 16. According to the second embodiment, two all-sold-state YAG 2ω lasers, the oscillation wave length thereof is 532 nm, are employed. Since the other steps and the laser irradiation conditions are the same with those according to the first embodiment, their duplicated descriptions are omitted for the sake of simplicity.

The activation of continuous layers according to the second embodiment assumes the formation of an n-type buffer layer (n-type field stop layer) and a pt-type collector layer in an FS-type IGBT. First, phosphorus ions (P⁺) are implanted at the dose amount of 1×10¹² cm⁻² and under the acceleration voltage of 700 keV into a silicon wafer. Then, boron ions (B⁺) are implanted at the dose amount of 1×10¹⁵ cm⁻² and under the acceleration voltage of 50 keV into the silicon wafer. Then, YAG 2ω laser pulses, the half widths thereof are 100 ns, are irradiated from two laser beam irradiators with a delay time of 400 ns. The impurity concentration profiles, measured by the spreading resistance profiling method, in the depth direction from the laser-irradiated surface (the surface irradiated with the laser pulses) of the silicon wafer obtained as described above are described in FIG. 8.

Figure 8:
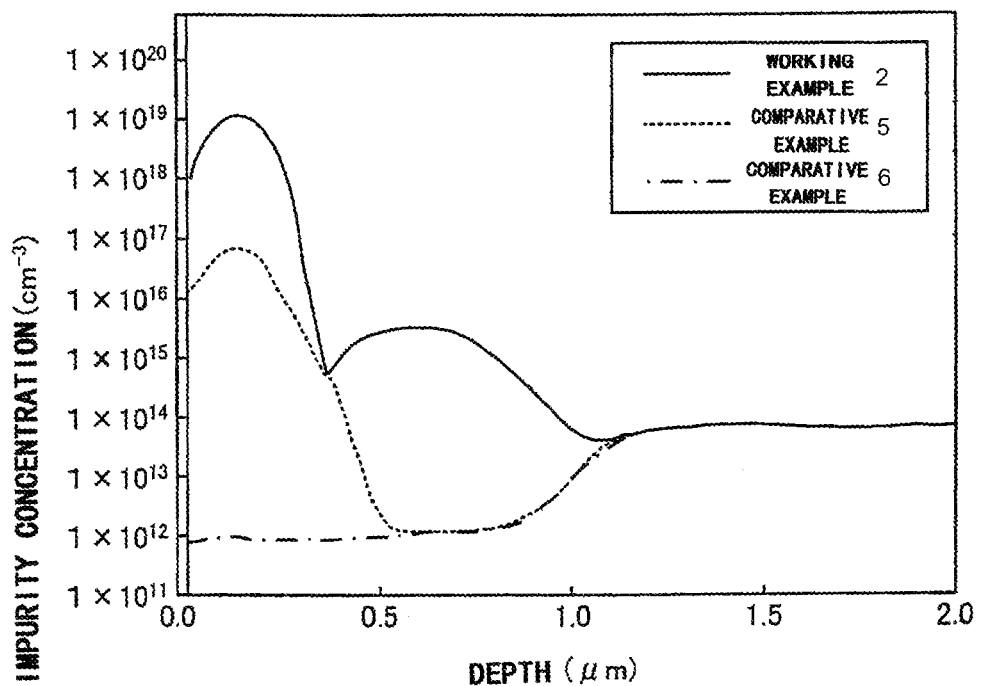
FIG. 8 is a set of curves describing the impurity concentration profiles in the depth direction from the silicon wafer surface according to a second embodiment of the invention.

In FIG. 8, the solid curve designated as the working example 2 represents the result obtained by irradiating the first laser beam at the irradiation energy density of 1.0 J/cm² and the second laser beam at the irradiation energy density of 0.6 J/cm². The dotted curve designated as the comparative example 5 and the single dotted chain curve designated as the comparative example 6 represent the results obtained by irradiating the first laser beam at the irradiation energy density of 0.7 J/cm² and the second laser beam at the irradiation energy density of 0.9 J/cm². The result of the comparative example 5 is obtained by measuring the region, on which any particle is not. The result of the comparative example 6 is obtained by measuring the region, on which particles are.

As FIG. 8 indicates, boron atoms are diffused sufficiently from the laser-irradiated-surface to the depth of around 0.3 μm and phosphorus atoms are diffused sufficiently from the depth of around 0.3 μm to the depth of around 0.8 μm according to the working example 2. It is found that insufficient activation is caused in the comparative example 5, since the irradiation energy densities are low and the impurity concentrations are low. It is found that the boron ions and the phosphorus ions are not activated at all according to the comparative example 6, since the particles on the silicon wafer surface are left unremoved.

Thus, it is found that insufficient activation will be caused in activating continuous layers in the same manner as in activating a monolayer, if the irradiation energy density of the first laser beam is lower than 1.0 J/cm², even when the total irradiation energy density of the first and second laser beams is 1.6 J/cm² or higher.

The manufacturing method according to the second embodiment of the invention exhibits the effects the same with those of the manufacturing method according to the first embodiment. The manufacturing method according to the second embodiment facilitates activating the continuous layers, the depths thereof are different from each other. In activating the continuous layers as described above, the diffusion depths and the concentrations of phosphorus and boron are adjusted by changing the delay time between the first pulse and the second pulse, by changing the irradiation energy densities of the first and second pluses, or by increasing the number of laser beam irradiators.

As an alternative for the manufacturing method according to the second embodiment that uses two all-solid-state layers or two excimer layers, the method for manufacturing a semiconductor device according to a third embodiment of the invention uses a semiconductor laser for the second laser. The penetration lengths of the all-solid-state laser beam and the excimer laser beam are from 0.01 μm to 1 μm. By irradiation any of these laser beams, it is possible to heat a region relatively near to the wafer surface up to around 1000° C. and to activate the region.

When the penetration length of an exciemr laser beam into silicon is around 0.1 μm, for example, the region extending from the wafer surface to the depth of 0.1 μm will be heated up to around 1000° C. By the diffusion of heat, the region extending from the wafer surface to the depth of around 0.5 μm can be activated.

The penetration length of a semiconductor laser beam, the wavelength thereof is around 794 nm, into silicon is about 10 μm. Therefore, the semiconductor laser facilitates heating and activating the region located relatively deep from the back surface of a silicon wafer.

In detail, when the penetration length of a semiconductor laser beam is about 10 μm, for example, the region extending from the wafer surface to the depth of 10 μm is heated up to around 500° C. The temperature obtained by heating with a semiconductor laser beam is lower than the temperature obtained by heating with an excimer laser beam. Therefore, the region that the semiconductor laser can activate is from the wafer surface to the depth of around 5.0 μm.

Figure 9:
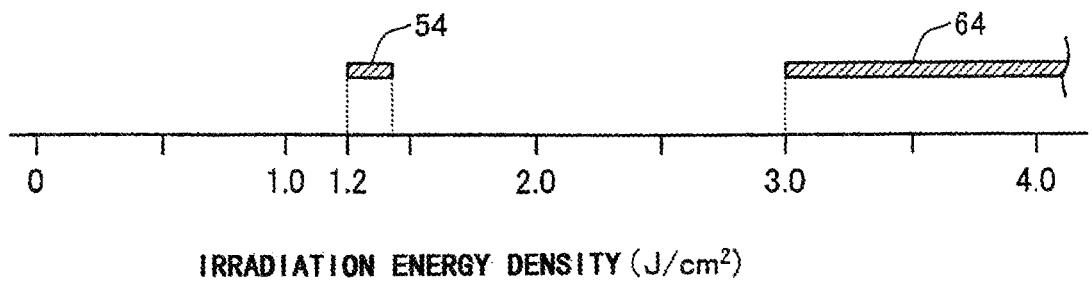
FIG. 9 is a diagram describing the effective ranges for the irradiation energy densities of an excimer laser and a semiconductor laser.

Now the effective ranges for the irradiation energy densities of an excimer laser beam and a semiconductor laser beam will be described below. FIG. 9 is a diagram describing the effective ranges for the irradiation energy densities of the excimer laser and the semiconductor laser. In FIG. 9, the effective range for the irradiation energy density of the excimer laser is preferably the range, in which the irradiation energy density is high enough to blow off particles on a wafer surface and to activate the surface portion of the wafer, from which the particles are blown off, but low enough to leave no machining trace in the wafer surface. The effective range for the irradiation energy density of the excimer laser is set as described above, since the semiconductor laser (the second laser) does not contribute to activating the region relatively near to the wafer surface, which the excimer laser (the first laser) activates. Therefore, it is preferable for effective range 54 for the irradiation energy density of the excimer laser to be 1.2 J/cm$^2$ or higher and 1.4 J/cm$^2$ or lower. Effective range 64 for the irradiation energy density of the semiconductor laser is 3.0 J/cm$^2$ or higher.

It is preferable for the upper limit of effective range 64 for the irradiation energy density of the semiconductor laser to be low enough not to affect the front surface side of the wafer and, specifically, low enough not to heat the aluminum electrode on the front surface side up to the melting point thereof (around 500° C.). Therefore, if the upper limit of effective range 64 for the irradiation energy density of the semiconductor laser is 30 J/cm$^2$ or higher, no problem will be posed.

The activation of continuous layers according to the third embodiment assumes the formation of an n-type buffer layer (n-type field stop layer) and a pt-type collector layer in an FS-type IGBT. First, phosphorus ions (Pt) are implanted at the dose amount of $1 \times 10^{12}$ cm$^{-2}$ and under the acceleration voltage of 700 keV into a silicon wafer. Then, boron ions (B$^+$) are implanted at the dose amount of $1 \times 10^{15}$ cm$^{-2}$ and under the acceleration voltage of 50 keV into the silicon wafer. Then, a laser pulse, the wavelength thereof is 308 nm and the half width thereof is 100 ns, is irradiated from a XeCl pulse laser and, then, a semiconductor laser beam, the wavelength thereof is 794 nm, is irradiated with a delay time of 400 ns. The impurity concentration profiles, measured by the spreading resistance profiling method, in the depth direction from the laser-irradiated surface (the surface irradiated with the laser pulse) of the silicon wafer obtained as described above are described in FIG. 10.

Figure 10:
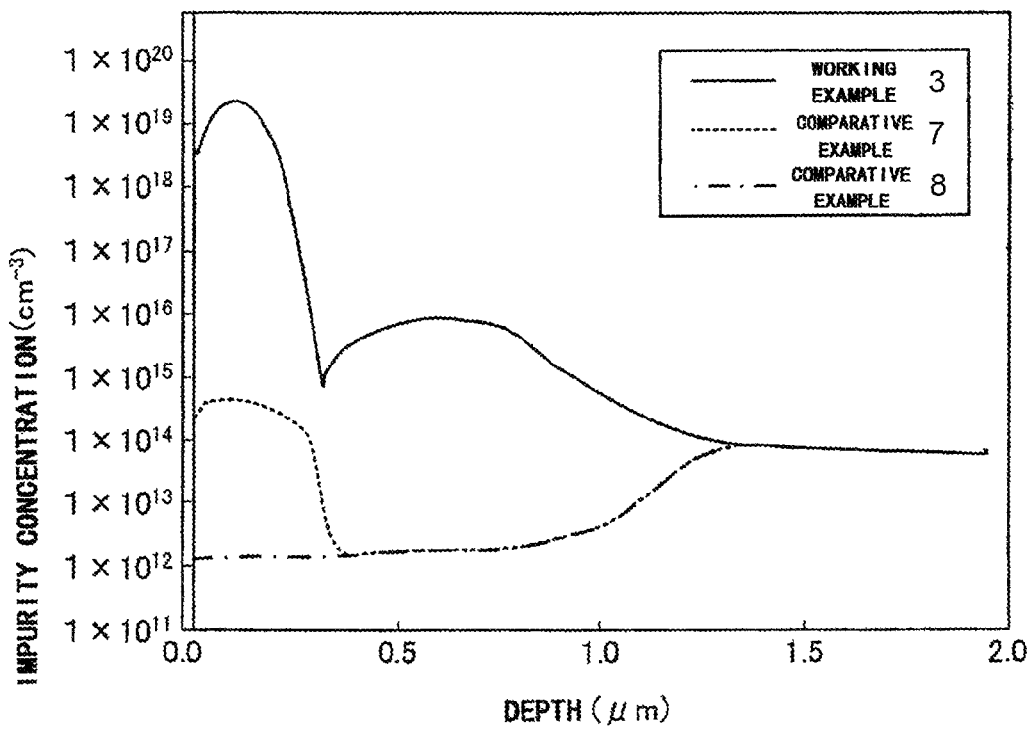
FIG. 10 is a set of curves describing the impurity concentration profiles in the depth direction from the silicon wafer surface according to a third embodiment of the invention.

In FIG. 10, the solid curve designated as the working example 3 represents the result obtained by irradiating the first XeCl pulse laser beam at the irradiation energy density of 1.3 J/cm$^2$ and the second semiconductor laser beam at the irradiation energy density of 4.0 J/cm$^2$. The dotted curve designated as the comparative example 7 and the single dotted chain curve designated as the comparative example 8 represent the results obtained by irradiating the first XeCl pulse laser beam at the irradiation energy density of 0.8 J/cm$^2$ and the second semiconductor laser beam at the irradiation energy density of 2.0 J/cm$^2$. The result of the comparative example 7 is obtained by measuring the region, on which any particle is not. The result of the comparative example 8 is obtained by measuring the region, on which particles are located.

As FIG. 10 indicates, boron atoms are diffused sufficiently from the laser-irradiated-surface to the depth of around 0.3 μm and phosphorus atoms are diffused sufficiently from the depth of around 0.3 μm to the depth of around 0.8 μm according to the working example 3. It is found that insufficient activation is caused according to the comparative example 7, since the irradiation energy densities are low and the impurity concentrations are low. It is also found that the phosphorus ions are not almost activated. It is found that the boron ions and phosphorus ions are not activated at all according to the comparative example 8, since the particles on the silicon wafer surface are left unremoved.

The manufacturing method according to the third embodiment of the invention exhibits the effects the same with those of the manufacturing methods according to the first and second embodiments. The manufacturing method according to the third embodiment is applicable to activating the region located relatively deep from the wafer surface.

As another alternative for the manufacturing method according to the second embodiment that uses two all-solid-state layers or two excimer layers, the method for manufacturing a semiconductor device according to a fourth embodiment of the invention uses a semiconductor laser for the first laser. The semiconductor laser beam is not affected adversely by the particles on the wafer surface, since the particles, 0.5 μm or less in diameter and on the wafer surface, do not exert their influences at all to activating the region located at the depth of 0.5 μm or deeper from the wafer surface.

When two laser beam irradiators are used according to the fourth embodiment, it is preferable for the irradiation energy density of the beam from an all-solid-state laser or from an excimer laser for the second laser to be 1.2 J/cm$^2$ or higher but low enough to leave no machining trance in the portion, irradiated with the laser beam, of the wafer back surface. The effective range for the irradiation energy density of the all-solid-state laser or the excimer laser (the second laser) is set as described above, since the semiconductor laser (the first laser) does not contribute to activating the region relatively near to the wafer surface, which the second laser (an all-solid-state laser or an excimer laser) activates.

When three or more laser beam irradiators are used, it is preferable for the irradiation energy density of the second laser beam from an all-solid-state laser or an excimer laser to be 1.0 J/cm$^2$ or higher but low enough to leave no machining trance in the portion, irradiated with the second laser beam, of the wafer back surface. It is preferable for the irradiation energy density of the third laser beam or the irradiation energy densities of further laser beams to be 0.6 J/cm$^2$ or higher but low enough to leave no machining trance in the portion, irradiated with the third laser beam or further laser beams, of the wafer back surface. The second laser beam is used for removing particles from the wafer surface and the third laser beam or further laser beams are used for activation.

The semiconductor laser may be used for irradiating a pulse beam but also for irradiating a continuous beam with no problem. Even if the semiconductor laser beam is irradiated continuously, any machining trace will not be left in the back surface of the wafer. Since the temperature of the region irradiated and heated with the semiconductor laser beam is low, the front surface side of the wafer is not affected adversely by the continuous irradiation of the semiconductor laser beam.

The manufacturing method according to the fourth embodiment of the invention exhibits the effects the same with those of the manufacturing methods according to the first through third embodiments. It is possible for the manufacturing method according to the fourth embodiment to blow off the particles on the wafer surface while activating the region located relatively deep from the wafer surface. Therefore, it is possible for the manufacturing method according to the fourth embodiment to reduce the period of laser annealing for activating continuous layers.

In the manufacturing methods according to the second through fourth embodiments, it is preferable for the wavelength of an all-solid-state laser or an excimer laser for activating the region relatively shallow from the wafer surface to be 150 nm or longer and 550 nm or shorter. Due to the optical absorption to silicon, the laser beam, the wavelength thereof is 150 nm or longer and 550 nm or shorter, facilitates activating the region, the depth thereof from the wafer surface is 0.3 μm or deeper and 1 μm or shallower.

Although a semiconductor laser, the wavelength thereof is 794 nm, is employed according to the third and fourth embodiments, other wavelengths may be used. The semiconductor laser wavelength may be selected appropriately as far as the desired irradiation energy density is obtained. For example, the semiconductor lasers, the wavelength thereof is 450 nm or longer and 900 nm or shorter, may be employable. Since the semiconductor laser, the wavelength thereof is 800 nm or longer and 900 nm or shorter, provides a laser light source, the output power therefrom is large, with low costs, the semiconductor laser, the wavelength thereof is 800 nm or longer and 900 nm or shorter, is advantageous for manufacturing semiconductor devices with low manufacturing costs.

If a semiconductor laser beam, the wavelength thereof is different from that of the pulse laser beam, is used, the region, the distance thereof from the wafer surface is different from that of the region activated with the pulse laser beam, can be activated. If the wavelength of the semiconductor laser beam is 800 nm or longer and 900 nm or shorter, the region, the depth thereof from the wafer surface is around 5 μm, may be activated by means of the optical absorption to silicon.

In addition to the YAG 2ω laser, a lithium yttrium fluoride (2ω) laser (hereinafter referred to as a "YLF 2ω laser") and an YVO$_4$ (2ω) laser, the fundamental wavelengths thereof are almost the same with the fundamental wavelength of the YAG 2ω laser (532 nm); and an YAG 3ω laser, a YLF 3ω laser and an YVO$_4$ (3ω) laser, the fundamental wavelengths thereof are around 355 nm, may be used for the all-solid-state laser with no problem. In addition to the XeCl laser (the wavelength thereof is 308 nm), a XeF laser (the wavelength thereof is 351 nm), a KrF laser (the wavelength thereof is 248 nm), and an ArF laser (the wavelength thereof is 193 nm) may be used for the excimer laser with no problem. By the annealing method according to the invention, the p-type single layer (collector layer) in the FS-type IGBT or in the reverse blocking IGBT may be activated with no problem. The invention is applicable not only to the IGBTs but also to the ICs and MOS semiconductor devices.

As described above, the method for manufacturing a semiconductor device according to the invention is advantageous for manufacturing thin semiconductor devices. Especially, the manufacturing method according to the invention is well suited to manufacturing IGBTs and such power semiconductor devices used in the industrial apparatuses such as general-purpose inverters, AC servos, uninterruptible power sources (UPS), and switching power supply apparatuses as well as in the civil instruments such as electric ovens, rice cookers and stroboscopes.

The invention has been described with reference to certain preferred embodiment thereof. It will be understood, however, that modifications and variations are possible within the scope of the appended claims.

This application is based on, and claims priority to, Japanese Patent Application No: 2008-316134, filed on Dec. 11, 2008. The disclosure of the priority application, in its entirety, including the drawings, claims, and the specification thereof, is incorporated herein by reference.

What is claimed is:

1. A method for manufacturing a semiconductor device, the method comprising the steps of:
   (a) irradiating a first pulse laser beam of an excimer laser to a surface of a semiconductor, thereto a dopant ion is implanted, with an irradiation energy density 1.0 J/cm$^2$ or higher and 1.4 J/cm$^2$ or lower for blowing off particles on the surface of the semiconductor, which leaves no machining trace; and
   (b) irradiating a second pulse laser beam of an excimer laser to the surface of the semiconductor with an irradiation energy density 0.6 J/cm$^2$ or higher and 1.4 J/cm$^2$ or lower to activate an impurity layer, thereto the dopant ion is implanted, which leaves no machining trace in the surface of the semiconductor.

2. The method according to claim 1, wherein a delay time between the first pulse laser beam irradiated in the step (a) and the second pulse laser beam irradiated in the step (b) is 0 ns or longer and 1000 ns or shorter.

3. The method according to claim 1, the method further comprising the step of:
   (c) irradiating a third pulse laser beam once or more times to the surface of the semiconductor with an irradiation energy density high enough to activate the impurity layer, thereto the dopant ion is implanted, but low enough to leave no machining trace the surface of the semiconductor, the step (c) being conducted in subsequent to the step (b).

4. The method according to claim 1, wherein the irradiation energy density for activating the impurity layer in the semiconductor, thereto the dopant ion is implanted, is 0.6 J/cm$^2$.

5. The method according to claim 1, wherein the impurity layer comprises a monolayer.

6. The method according to claim 1, wherein the impurity layer comprises continuous layers, conductivity types thereof are the same or the conductivity types thereof are different from each other.

7. The method according to claim 1, wherein the dopant ions are boron or phosphorus.

8. A method for manufacturing a semiconductor device, the method comprising the steps of:
   (a) irradiating a first pulse laser beam of an excimer laser to a surface of a semiconductor, thereto dopant ions are implanted, with an irradiation energy density 1.2 J/cm$^2$ or higher and 1.4 J/cm$^2$ or lower for blowing off particles on the surface of the semiconductor and for activating a first impurity layer without leaving any machining trace in the surface of the semiconductor; and
   (b) irradiating a semiconductor laser beam to the surface of the semiconductor for activating a second impurity layer located more deeply than the first impurity layer activated through the step (a).

9. The method according to claim 8 wherein a wavelength of the pulse laser beam is 150 nm or longer and 550 nm or shorter, and a wavelength of the semiconductor laser beam is different from the wavelength of the pulse laser beam.

10. The method according to claim 8, wherein the dopant ions are boron or phosphorus.

11. A method for manufacturing a semiconductor device, the method comprising the steps of:
   (a) irradiating a semiconductor laser beam to a surface of a semiconductor, thereto dopant ions are implanted, for activating a first impurity layer; and
   (b) irradiating a first pulse laser beam of an excimer laser to the surface of the semiconductor, with an irradiation energy density 1.2 J/cm$^2$ or higher and 1.4 J/cm$^2$ or lower for blowing off particles on the surface of the semiconductor and for activating a second impurity layer located more shallowly than the first impurity layer activated through the step (a), which leaves no machining trace in the surface of the semiconductor.

12. The method according to claim 11, wherein the semiconductor laser beam is irradiated continuously.

13. The method according to claim 11 wherein a wavelength of the pulse laser beam is 150 nm or longer and 550 nm or shorter, and a wavelength of the semiconductor laser beam is different from the wavelength of the pulse laser beam.

14. The method according to claim 11, wherein the dopant ions are boron or phosphorus.

15. A method for manufacturing a semiconductor device, the method comprising the steps of:
- (a) irradiating a semiconductor laser beam to a surface of a semiconductor, thereto a first dopant ion and a second dopant ion are implanted, for activating a first impurity layer;
- (b) irradiating a first pulse laser beam of an excimer laser to the surface of the semiconductor with an irradiation energy density 1.2 J/cm² or higher and 1.4 J/cm² or lower for blowing off particles on the surface of the semiconductor, which leaves no machining trace in the surface of the semiconductor; and
- (c) irradiating a second pulse laser beam of a semiconductor laser to the surface of the semiconductor with an irradiation energy density high enough to activate a second impurity layer, thereto the second dopant ion is implanted, but low enough to leave no machining trace in the surface of the semiconductor for activating the second impurity layer located more shallowly than the first impurity layer activated through the step (a).

16. The method according to claim 15, wherein a delay time between the first pulse laser beam irradiated in the step (b) and the second pulse laser beam irradiated in the step (c) is 0 ns or longer and 1000 ns or shorter.

17. The method according to claim 15, wherein the irradiation energy density necessary for activating the second impurity layer, into which the second dopant ion is implanted, is 0.6 J/cm².

18. The method according to claim 15 wherein a wavelength of the pulse laser beam is 150 nm or longer and 550 nm or shorter, and a wavelength of the semiconductor laser beam is different from the wavelength of the pulse laser beam.

19. The method according to claim 15, wherein the first and second dopant ions are selected from the group consisting of boron and phosphorus.

* * * * *